US006526085B2

(12) United States Patent
Vogler et al.

(10) Patent No.: US 6,526,085 B2
(45) Date of Patent: *Feb. 25, 2003

(54) PERFORMANCE CONTROL SYSTEM AND METHOD FOR GAS DISCHARGE LASERS

(75) Inventors: Klaus Wolfgang Vogler, Göttingen (DE); Peter Heist, Jena (DE)

(73) Assignee: Lambda Physik AG, Goettingen (DE)

(*) Notice: Subject to any disclaimer, the term of this patent is extended or adjusted under 35 U.S.C. 154(b) by 0 days.

This patent is subject to a terminal disclaimer.

(21) Appl. No.: 10/035,572
(22) Filed: Oct. 18, 2001
(65) Prior Publication Data

US 2002/0057724 A1 May 16, 2002

Related U.S. Application Data

(63) Continuation of application No. 09/718,805, filed on Nov. 22, 2000, now Pat. No. 6,330,267, which is a continuation of application No. 09/379,034, filed on Aug. 23, 1999, now Pat. No. 6,212,214
(60) Provisional application No. 60/150,683, filed on Aug. 5, 1999, and provisional application No. 60/160,084, filed on Oct. 5, 1998.

(51) Int. Cl.$^7$ .................................................. H01S 3/22
(52) U.S. Cl. ............................... 372/58; 372/59; 372/57
(58) Field of Search ............................... 372/57, 58, 59, 372/60, 55

(56) References Cited

U.S. PATENT DOCUMENTS

| 3,899,750 A | 8/1975 | Hochuli ................. 331/95.5 G |
| 4,429,392 A | 1/1984 | Yoshida et al. ................. 372/9 |

(List continued on next page.)

FOREIGN PATENT DOCUMENTS

| DE | 3212928 A | 10/1983 | .............. H01S/3/02 |
| DE | 19618119 A1 | 11/1996 | ............. H01S/3/134 |
| DE | 29713755 U1 | 8/1997 | .............. H01S/3/03 |
| JP | 10341050 | 12/1998 | |

OTHER PUBLICATIONS

V.F. Weisskopf, et al., *Z. Physik*, 63, 54 1930.

(List continued on next page.)

*Primary Examiner*—Leon Scott, Jr.
(74) *Attorney, Agent, or Firm*—Sierra Patent Group, Ltd.; Andrew V. Smith

(57) ABSTRACT

A method is provided for determining the status of a gas mixture of a laser system including a gas discharge laser which generates an output beam and has a discharge chamber containing a gas mixture within which energy is supplied to the gas mixture by a power supply via application of a driving voltage to a discharge circuit. A master data set of an output parameter such as any of output beam energy, bandwidth, spectrum width, long axial beam profile, short axial beam profile, beam divergence, energy stability, energy efficiency, width of the discharge, temporal beam coherence, spatial beam coherence, spatial pulse width, amplified spontaneous emission and temporal pulse width versus an input parameter such as driving voltage is generated corresponding to an optimal gas mixture status, preferably after a new fill and typically at the factory, and alternatively following a new fill at the fab. Preferably several master data sets are measured and stored following new fills corresponding to various ages and other conditions of the laser system. The master data set is stored into a memory of the control system. Several more calibration data sets are also preferably generated corresponding to other gas mixture or laser operating conditions. At another time, during a check sub-routine preferably during a subsequent start-up procedure or during each subsequent start-up procedure, a current status data set of the output and input parameters is generated corresponding to the current status of the gas mixture. The current status data set is then compared with the master data set and deviations of the current status and master data sets are noted. A follow-up procedure may be performed, preferably automatically as initiated by the processor, based on the comparison.

32 Claims, 5 Drawing Sheets

U.S. PATENT DOCUMENTS

| | | | | |
|---|---|---|---|---|
| 4,534,034 A | * | 8/1985 | Hohla et al. | 372/59 |
| 4,716,569 A | | 12/1987 | Bees | 372/38 |
| 4,722,090 A | | 1/1988 | Haruta et al. | 372/57 |
| 4,740,982 A | * | 4/1988 | Hakarya et al. | 372/59 |
| 4,756,336 A | | 7/1988 | Stephens | 372/81 |
| 4,856,007 A | | 8/1989 | Weiss | 372/29 |
| 4,964,137 A | | 10/1990 | Aramaki et al. | 372/59 |
| 4,977,573 A | | 12/1990 | Bittenson et al. | 372/81 |
| 5,090,020 A | | 2/1992 | Bedwell | 372/59 |
| 5,097,291 A | | 3/1992 | Suzuki | 355/69 |
| 5,142,543 A | | 8/1992 | Wakabayashi et al. | 372/32 |
| 5,149,659 A | * | 9/1992 | Hakuta et al. | 372/59 |
| 5,260,961 A | * | 11/1993 | Zhou et al. | 372/57 |
| 5,315,610 A | | 5/1994 | Alger et al. | 372/55 |
| 5,377,215 A | | 12/1994 | Das et al. | 372/57 |
| 5,396,514 A | | 3/1995 | Voss | 372/57 |
| 5,440,578 A | | 8/1995 | Sandstrom | 372/59 |
| 5,450,436 A | * | 9/1995 | Mizoguchi et al. | 372/59 |
| 5,586,134 A | | 12/1996 | Das et al. | 372/38 |
| 5,590,146 A | | 12/1996 | von Borstel | 372/58 |
| 5,642,374 A | * | 6/1997 | Wakabayashi et al. | 372/57 |
| 5,646,954 A | | 7/1997 | Das et al. | 372/55 |
| 5,754,579 A | * | 5/1998 | Mizoguchi et al. | 372/58 |
| 5,802,095 A | | 9/1998 | Schall | 372/89 |
| 5,887,014 A | | 3/1999 | Das | 372/59 |
| 5,978,406 A | * | 11/1999 | Rokni et al. | 372/58 |
| 6,005,879 A | | 12/1999 | Sandstrom et al. | 372/25 |
| 6,014,398 A | * | 1/2000 | Hofmann et al. | 372/60 |
| 6,212,214 B1 | * | 4/2002 | Vogler et al. | 372/59 |

OTHER PUBLICATIONS

J.H. Eberly, "Superradiance Revisited," *American Journal of Physics,* vol. 40/10, Oct. 1972.

G. M. Jurish, et al., "Gas Contaminant Effects in Discharge–excited KrF Lasers," *Applied Optics,* vol. 31, Apr. 1992.

Lambda Physik Highlights, Apr. 1993.

R. Pätzel, et al., "KrF Excimer Laser with Repetition Rates of 1 kHz for DUV Lithography," *SPIE,* vol. 2440, 101, 1995.

* cited by examiner

OUTPUT ENERGY IS DEPENDENT ON
FLUORINE PARTIAL PRESSURE (QUALITATIVELY)
OF A KrF-EXCIMER LASER

GRAPH E, LASER OUTPUT ENERGY
VERSUS VOLTAGE OF THE DRIVING CIRCUIT

DROP OF THE GRAPHS E DURING AGING
OF THE GAS MIXTURE E.G. $F_2$

DECREASE OF THE SLOPE OF THE $E(\mu)$
CURVE BY DEPLETION OF THE $F_2$ PORTION
WITHIN THE DISCHARGE CHAMBER

PERFORMANCE CONTROL SYSTEM AND METHOD FOR GAS DISCHARGE LASERS

PRIORITY

This Application is a continuation application which claims the benefit of priority under 35 U.S.C. 1.53(b) to U.S. patent application Ser. No. 09/718,805, filed Nov. 22, 2000 now U.S. Pat. No. 6,330,267, which is a continuation and claims the benefit of priority under 35 U.S.C. 1.53(b) to U.S. patent application Ser. No. 09/379,034, filed Aug. 23, 1999, now U.S. Pat. No. 6,212,214, issued Apr. 3, 2001, which claims the benefit of priority to U.S. provisional patent applications No. 60/160,084, filed Oct. 5, 1998, and No. 60/150,683, filed Aug. 5, 1999, said applications being incorporated herein by reference.

BACKGROUND OF THE INVENTION

1. Field of the Invention

The present invention relates to a method and apparatus for determining a status of a laser gas mixture within a discharge chamber of a gas discharge laser, and more particularly for measuring a parameter of the output laser beam versus the applied driving discharge voltage or other adjustable input parameter and comparing the measured data with a master set or sets of stored data to determine the status of the laser gas mixture and/or whether any electrical, mechanical or optical problems exist within the system.

2. Discussion of the Related Art

Gas discharge lasers, e.g., excimer or molecular lasers, are well known as valuable tools for many industrial applications. There is a great desire to have precise control and simultaneous stabilization of many laser parameters over extended durations of operation, especially with regard to excimer laser applications in many fields including electronics and photolithographic processing. The amount of "up time" of a laser, or time when a laser is in operation and being used for industrial application, is a key variable in operation cost considerations. It is desired to be able to successively adjust, sensitively control and carefully stabilize various laser parameters efficiently and simultaneously.

The type and quality of the gas discharge affects many significant laser parameters such as output power, energy stability, efficiency, bandwidth, long and short axial beam profiles, temporal and spatial pulse width, and beam divergence and coherence. The quality of the gas discharge depends on such factors as the composition of the gas mixture in the discharge chamber, the quality of preionization used, properties of the discharge circuit, and profiles of the electrodes used. See R. S. Taylor, Appl. Phys. B41, 1–24 (1986). Decomposition and contamination of the gas mixture and the design of the gas exchange system (e.g., flow speed) also strongly determine the limits of achievable laser parameters. A fast gas exchange between electrodes may be realized by using a laser discharge chamber design including fast blower gas circulation. Cryogenic and electrostatic equipment and techniques may be used for additional gas purification. See German Patent No. 32 12 928.

Optimum gas mixtures for various gas discharge lasers are generally known. A partition of 0.1:1.0:98.9 $F_2$:Kr:Ne is thought to be substantially optimal for a KrF-excimer laser, for example, and 0.1:99.9 $F_2$:Ne for an $F_2$ laser. FIG. 1 shows a plot of laser output power versus $F_2$ concentration and represents a way of determining what the optimal $F_2$ concentration actually is. As time goes by and the laser is operated, the gas mixture degrades or "ages" continuously resulting in a dilution of $F_2$ and a consumption of $F_2$ via chemical reactions with metal dust. In this regard, U.S. Pat. No. 4,977,573 to Bittenson et al., which is assigned to the same assignee as the present application, is incorporated herein by reference. After a parameter changes by a certain amount, such as after a certain amount of time, number of pulses or change in discharge voltage compensating the gas deterioration to maintain constant output energy, among others, a replenishment such as halogen injection (HI) or partial gas replacement (PGR) of a certain amount of the gas mixture or an entirely new fill of the gas mixture is performed to, as nearly as possible, substantially reinstate the original partition of the gas and optimize laser parameters.

It is desired to be able to prolong the lifetime of the laser gas mixture. It is further desired to have suitable measuring tools that indicate when and to what extent the laser gas mixture is aged before problems associated with laser parameters varying from optimum as the laser gas degrades lead to significant reductions in laser output performance, processing errors and excessive laser downtime.

A mass spectrometer may be used for precision analysis of the composition of the gas mixture. See U.S. Pat. No. 5,090,020 to Bedwell. However, a mass spectrometer is an undesirably hefty and costly piece of equipment to incorporate into a continuously operating excimer or molecular laser system. Other ways of monitoring the status of a laser gas mixture include measuring a spectrum width or bandwidth of a laser emission (see U.S. Pat. No. 5,450,436 to Mizoguchi et al.), measuring a beam profile of the laser emission (see U.S. Pat. No. 5,642,374 to Wakabayashi et al.), and measuring other characteristics such as the width of the discharge or temporal pulse width of the output beam wherein a rough estimate of the status of the gas mixture may be made. See U.S. Pat. No. 5,440,578 to Sandstrom. Another known technique of measuring the age of the laser gas mixture is to count the total number of laser pulses from the most recent new fill of the discharge chamber. See U.S. Pat. No. 5,646,954 to Das et al.

A number of techniques are known wherein the output beam energy or efficiency is monitored and steps are taken to maintain the output beam at an optimum energy. See U.S. Pat. No. 3,899,750 to Hochuli, U.S. Pat. No. 4,429,392 to Yoshida et al., and U.S. Pat. No. 4,977,573 to Bittenson et al. Rare and halogen gas concentrations have also been maintained by using a complex series of chemical reactions to determine the gas mixture concentrations and replenish depleted gases as needed. See U.S. Pat. No. 4,740,982 to Hakuta et al.

The above parameters measured and monitored for determining the status of the laser gas mixture are each dependent on other parameters in addition to the gas mixture status, e.g., stabilized output energy, repetition rate, etc. They are based on generally known behaviors of laser systems and general experience regarding gas mixture aging in discharge chambers. It is desired to have a technique for monitoring the gas mixture status without variations in other parameters affecting the analysis. It is also desired that properties of the discharge chamber, optics and discharge circuit, among others, be taken into account in a gas mixture status monitoring procedure to provide greater completeness and accuracy.

SUMMARY OF THE INVENTION

An effective and sensitive method and apparatus for determining a status of a gas mixture and its degree of aging or degradation is provided by the present invention. An internal computer control system determines a status of a laser gas mixture in a discharge chamber preferably during a special check sub-routine. An output beam parameter, e.g., pulse energy, bandwidth, long or short axial beam profile, energy stability, energy efficiency, amplified spontaneous emission (ASE), discharge width, beam divergence, beam coherence, spatial pulse width or temporal pulse width, versus an input parameter, e.g., driving voltage, are measured and stored by an internal control system. The measured data are then compared with a master profile or master set of data measured when optimal gas mixture conditions exist such as after a new fill of the discharge chamber with the gas mixture. Preferably, multiple master data sets are measured each corresponding to different operating conditions of the laser separate from gas mixture status.

A method is provided for determining the status of a gas mixture of a gas laser system which generates an output beam having at least one characteristic parameter that is measurable, e.g., output pulse energy, bandwidth, long or short axial beam profile, energy stability, energy efficiency, amplified spontaneous emission (ASE), discharge width, beam divergence, beam coherence, spatial pulse width or temporal pulse width, within the system and has a discharge chamber containing a gas mixture within which energy is supplied to the gas mixture by a power supply via application of a driving discharge voltage to electrodes of a discharge circuit. A master profile or master data set of the output beam parameter is measured versus an input parameter such as driving voltage for a laser having specified operating conditions preferably including an optimal gas mixture depending on the operating conditions. This master data set is stored into the memory of the control system of the laser for which it is desired to measure the status of the gas mixture at later times. At another time, preferably during a check sub-routine such as during a start-up procedure or during each start-up procedure, a current status data set of the output beam parameter measured in the master data set versus the input parameter measured in the master data set is measured for the gas discharge laser. The current status data set is then compared with the master data set and deviations are noted, such as in the values and/or derivatives, e.g., slopes, or integrals at data points along the curves defined by the data sets.

A small deviation, e.g., of value or slope, between the master and current status data sets will typically indicate that the laser gas mixture has aged or that the $F_2$ concentration of the gas mixture is somewhat depleted. A large deviation may indicate that a complete new fill is necessary or that serious mechanical, electrical or optical hardware problems are present in the system. A follow-up procedure is then preferably performed depending on whether and what type of deviation exists between the master and current status data sets.

A current data set may be measured after a new fill, and the data set compared with the master data set obtained after a previous new fill. When deviations are present between the master and current data sets just after a new fill, assuming operating conditions haven't otherwise been changed, then hardware problems are suspected, as aging of the gas mixture will have not yet occurred.

In the preferred embodiment, one or more calibration data sets are initially measured and stored corresponding to different gas mixture statuses and/or operating conditions of the laser. A processor compares a current status data set which is deviated from the master data set with one or more of the calibration data sets to find the calibration data set which is most similarly deviated from the master data set.

The processor then determines, from stored gas mixture data regarding the similarly deviated calibration data set, what type of follow-up procedure should be performed. For example, a follow-up procedure may include replenishment of a certain amount of a molecule including an active halide species such as $F_2$, or HCl, an active rare gas or a combination of a molecular halide and an active rare gas.

A gas discharge laser system is also provided. The laser system includes a discharge chamber containing a laser gas mixture and a resonator for generating a laser beam. A power supply circuit delivers energy to the gas mixture by providing a driving voltage to a discharge circuit that ultimately produces a potential difference across electrodes in the discharge chamber. The system further includes means for measuring an input parameter, e.g., the driving voltage, and means for measuring an output beam parameter which varies with the status of the gas mixture, such as one of those mentioned above, e.g., the output power of the laser beam. A processor then receives the input and output parameter measurements as a current status data set. The current status data set is compared with a master data set that represents a substantially optimal gas mixture and a laser operation status. The master data set used may differ between laser systems of varying ages or other operating conditions such as repetition rate. The current status data set may also be compared with one or more calibration data sets, such as were measured, e.g., following one or more halogen replenishment procedures, during an initial start-up procedure, during one or more subsequent start-up procedures, after subsequent new fills or under other than optimal gas mixture conditions. Follow-up procedures may be performed depending on the types of deviations, such as values, derivatives or integrals at points along curves defined by the data sets, noted from the comparison.

DETAILED DESCRIPTION OF THE PREFERRED EMBODIMENT

According to the present invention, an output parameter and an input parameter are measured under optimal gas laser conditions and under various other conditions of the gas mixture and laser system to establish at least a master data set and preferably one or more calibration data sets. During subsequent operation of the laser, the same parameters are measured to establish a current data set associated with current gas mixture and laser operating conditions. The current data set may be measured using a same or a different laser than the master data set. One or more calibration data sets may also be measured and stored using a same or a different laser as the current data set. The master and calibration data sets may also be measured using a same or a different laser. The current data set is compared to the master data set, and also preferably at least one of the one or more calibration data sets particularly when deviations are found between the master and current data sets. In a preferred embodiment of the present invention as described below and in the accompanying drawings, the output beam parameter is pulse energy and the input parameter is driving voltage. Other parameters may be used as the measured output beam parameter such as bandwidth or spectrum width, long or short axial beam profiles, beam divergence, temporal or spatial beam coherence, energy stability, energy efficiency, the width of the discharge and temporal or spatial pulse width or another parameter which varies with gas mixture status of a gas laser such as an excimer or molecular laser. The input parameter may be another parameter which varies as the laser system operates and/or statically ages.

Figure 1:
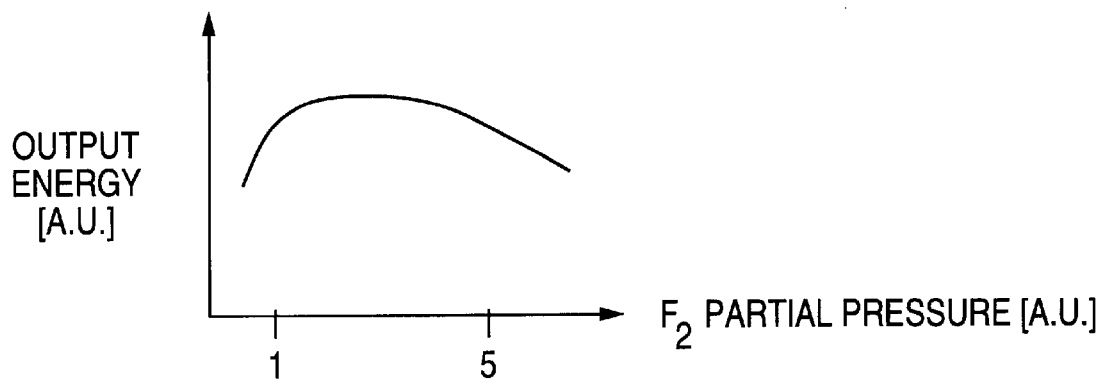
FIG. 1 is a graph of laser output energy versus $F_2$ partial pressure for a KrF-excimer laser showing that a maximum in output energy exists at a determinable $F_2$ partial pressure.
Figure 2:
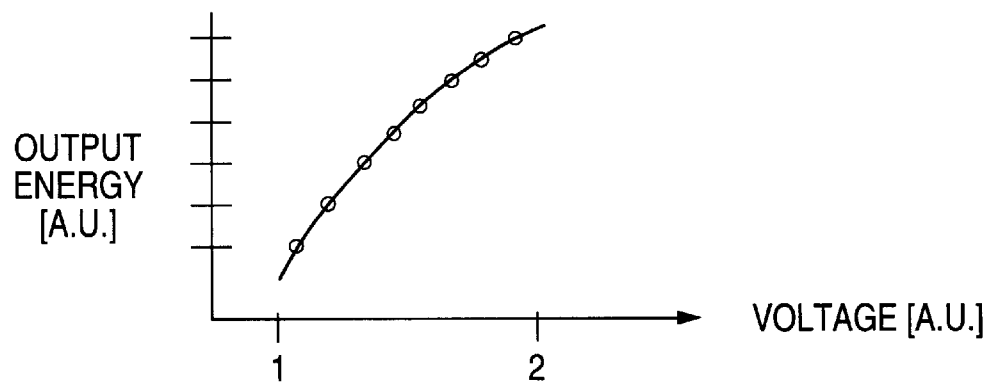
FIG. 2 is a graph showing the qualitative dependence of laser output energy on driving voltage of a discharge chamber of a gas discharge laser.

FIG. 2 shows a qualitative plot of the output energy of a gas laser as a function of driving voltage of a driving circuit of the laser. The driving voltage measured is preferably that which is applied to the discharge circuit from a power supply of the laser. The power supply typically charges a charging capacitor that is connected to a step-up transformer. The connection is switch controlled. A voltage from the step-up transformer is applied to a set of electrodes in the discharge chamber. Another voltage may be alternatively measured such as the voltage across the electrodes or the voltage of the charging or peaking capacitors.

In this way, energy is delivered to the laser gas to excite molecules within it to higher energy states, from which deexcitation of the molecules is responsible for lasing action. For some lasers, this voltage is applied to a pump medium, rather than the laser active gas itself, but a driving voltage (or current) is nonetheless present in nearly every known gas laser system. As shown, the slope of the curve of laser output energy versus driving voltage of FIG. 2 is everywhere positive and decreasing with voltage. This graph has been generated using data values measured experimentally for a wide variety of gas discharge lasers. That is, the graph shown in FIG. 2 generally shows a characteristic which is common to gas discharge lasers, including excimer and molecular lasers such as KrF, ArF, $F_2$, XeCl, XeF, and KrCl lasers.

The graph of FIG. 2 represents a data set may stored in an internal computer control system (hereinafter "processor") of a laser system. The computer receives data representing values preferably of the driving voltage applied to the main discharge circuit from a power supply, while at the same time receiving data preferably of the output energy, or power, of the laser beam from an energy or power meter. Several data points of the output energy versus the driving voltage are measured and stored. Preferably a graph such as that shown in FIG. 2 is generated and produced by the processor. The data is taken and the graph is generated preferably during a special subroutine performed during a start-up sub-routine of the gas laser system wherein it is desired to check the quality of the laser gas mixture within the discharge chamber.

In fact, the relationship between driving voltage and laser output energy has a unique dependence on specific characteristics of the laser gas mixture. Inspection of the graph generated during the start-up procedure indicates quantities relating to the laser gas mixture such as the relative apportionment of individual gases, total pressure, and the aging and degradation of the gas mixture. It follows that a comparison of two graphs generated at different times, such as during two different start-up procedures, reveal differences in the status of the laser gas mixtures at the two different times when the graphs were generated. Hardware and other discrepancies of the system are also discernible between the two setups at the two different times by comparing the two graphs.

A master data set is measured preferably using a laser system which is optimally configured and has not yet aged. That is, a new fill of a laser gas mixture is performed preferably just prior to measuring the data of the master data set. At this time, the laser gas mixture has not yet aged and the apportionment of each of the gases, or the percentages of each gas that comprises the laser gas mixture, is optimal. Moreover, all of the hardware of the system including the electronics and the optics, as well as the optical alignment of each optical module of the system, is optimal when the master data set which may be represented by a master graph generated from the master data set is measured. This master data set, after all of the above are verified, is then stored as a master data set to be compared to each subsequently measured data set. The master data set is preferably measured using data taken after an initial new fill and warming up of the laser gas mixture to equilibrium temperature of operation. Measuring the master data set, which is preferably followed by generating a master graph from the master data set, is followed by communicating and storing the master data set into a memory accessible by the processor, preferably automatically. The master data set may typically be measured at the factory after manufacture of a new laser. The master data set may be generated with the same laser as or with a different laser than it is desired to be able to learn the gas mixture status of at a later time.

More than one master data set may be generated using a laser or lasers of various ages, wherein one is preferably generated using a new laser. As a gas laser itself ages, data sets measured when the gas mixture and other system components are otherwise optimal will typically vary. Thus, it is preferred to have more than one master data set, each master data set corresponding to a different age range of the laser itself. For example, three master data sets may be measured, and master graphs preferably generated therefrom, and used in the present invention. The first master data set corresponds to an optimal condition of a laser that is, e.g., less than $10^9$ laser pulses old. The second corresponds to an optimal condition of a laser that is, e.g., from $1$–$2.5 \times 10^9$ laser pulses old. The third corresponds to an optimal condition of a laser that is, e.g., older than $2.5 \times 10^9$ pulses old.

Preferably, several "calibration" data sets are also measured and stored in the memory accessible by the processor. Each calibration data set corresponds to a different status of the gas mixture. A bank of data sets corresponding to gas mixtures of various aging states and including various $F_2$ concentrations are then available for the processor to compare with subsequently generated data sets corresponding to gas mixtures that are determined to be deviated from optimal, but have an unknown precise status. Calibration data sets may be measured and stored corresponding to other laser system conditions that practitioners know and learn develop with time, pulse count or other parameter which evolves as the laser is operated and/or static or off or in an intermediate mode.

In this way, the processor analyzes many values related to several previously measured data sets of preferably output beam energy versus driving voltage, and preferably generating graphs or curves from the data, and compares them to a current data set to determine the current status of the gas mixture. Electrical and mechanical hardware and optical alignment and degradation problems may also arise from time to time and can be noticed during the check sub-routine described above, realizing another advantage of the present invention.

It is, however, the typical and systematic aging and degradation of the laser gas mixture which is uniquely observable via comparison between the master data set and/or other previously measured and stored calibration data sets and the current data set measured at some particular time after measuring the master data set and the other graphs. The magnitude and slope variances, in particular, between curves or graphs representing the master data set and the current data set, e.g., indicate important characteristics of the laser gas mixture. One such characteristic is the degree to which the gas mixture is generally aged and degraded at the time the second data set is measured. Another characteristic is the reduction of specific gases, such as, e.g., $F_2$, within the mixture from the time of the most recent new fill until the time the second data set is generated.

Figure 3A:
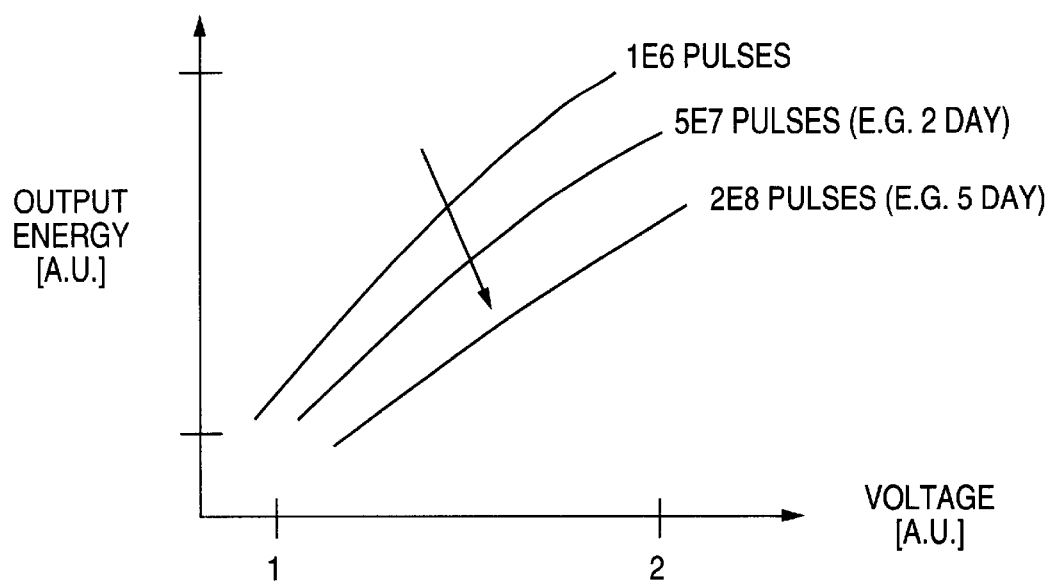
FIG. 3a shows how the graph of laser output energy versus driving voltage of FIG. 2 shifts downward with the age of the laser gas mixture.

The magnitudes, slopes, etc. of data sets of the output beam parameter, e.g., energy, of the laser for a given value of the input parameter, e.g., driving voltage, depend on the aged status, or the age, of the laser gas mixture, and are measured preferably in time or pulse count from the most recent new fill, but may reference another event significant to the laser system. FIG. 3a qualitatively shows how the output energy magnitude decreases as the laser gas mixture ages with time. Three curves are shown in FIG. 3a. The topmost curve is a master curve generated using a new or nearly new laser and data taken immediately or nearly immediately after a new fill, such as one million pulses afterwards. The middle curve was generated using data taken sometime, e.g., two days or 50 million pulses, after a new fill. The bottom curve was generated using data taken sometime even later, e.g., five days or 100 million pulses after a new fill.

It is observed from FIG. 3a that as the laser gas mixture ages, the curve shifts downward at an expected rate. After more than one new fill, for instance, it can be estimated based on experiences following previous new fills how much the laser gas mixture has aged. As the gas mixture ages, many changes take place including reduction of halogen concentration, and build-up of contaminants such as, e.g., $CF_4$, and dust. This information is important because appropriate follow-up measures can be taken to ensure the reliability of the output beam, which may be used in precise industrial applications.

Figure 3B:
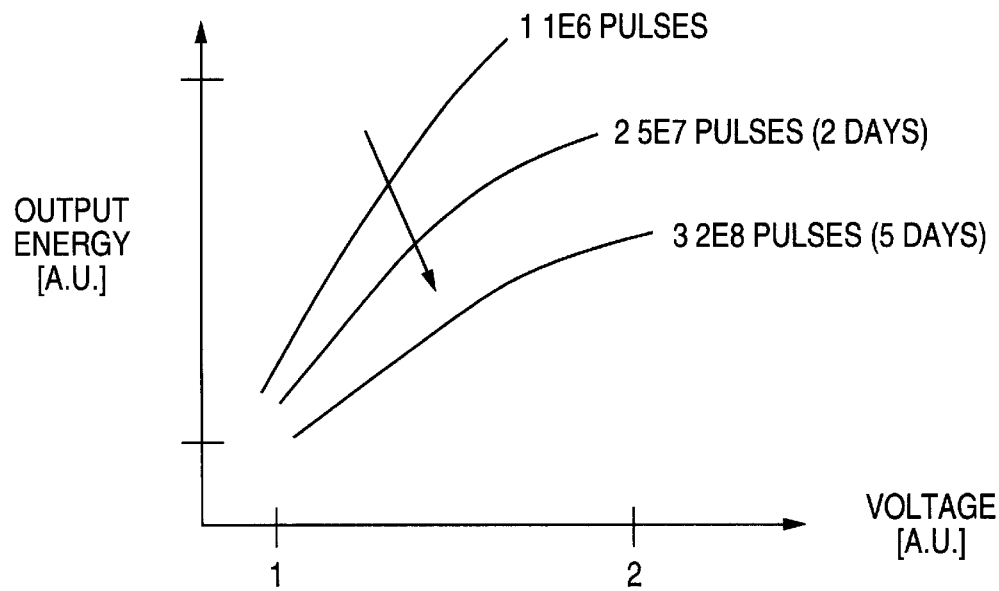
FIG. 3b shows how the slope of the laser output energy versus driving voltage curve of FIG. 2 depends on the $F_2$ concentration within the laser gas mixture.

The slope of the curve of output energy of the gas laser versus driving voltage also depends on the percentage concentration of $F_2$ within the laser gas mixture. FIG. 3b qualitatively shows how this slope decreases as the percentage concentration of $F_2$ within the laser gas mixture decreases. The curves of FIG. 3b differ from those of FIG. 3a because only $F_2$ concentration is varied between the curves of FIG. 3b, while, as mentioned above, other factors, such as contaminant and dust build-up that occur as the laser gas mixture ages, influence the shapes of curves of FIG. 3a.

Three curves are shown in FIG. 3b. The topmost curve is a master curve generated using the master data set from a laser having a first $F_2$ concentration. The middle curve was generated using data from a laser having a second $F_2$ concentration lower than the first concentration. The bottom curve was generated using data from a laser having a third $F_2$ concentration lower than either of the first or second concentrations. It is observed from FIG. 3b that as the percentage $F_2$ concentration decreases, the slope of the curve decreases at an expected rate. After more than one new fill, for instance, it can be estimated based on experiences following previous new fills how much the $F_2$ concentration has decreased. This information is important because appropriate follow-up measures such as reinstating the optimal percentage $F_2$ concentration can be taken to ensure the reliability of the output beam, which may be used in precise industrial applications. Comparison of curves such as those of FIG. 3b may also yield characteristic signs of percentage concentration reduction with time of other gases of the laser gas mixture.

In summary with respect to FIGS. 3a and 3b, aging of the laser gas mixture is observed from a drop of the laser output energy versus driving voltage at a given voltage, revealed by a shift downward of the curve as shown in FIG. 3a. A lack of certain gas components, such as $F_2$, can be observed from a decrease in the slope of the laser output energy versus driving voltage curve as shown in FIG. 3b. Comparing a master graph generated using a master data set measured immediately or nearly immediately after a new fill of a laser with a second graph generated using data measured during a check sub-routine of the laser system such as during a start-up procedure for the laser, and analyzing deviations between the two graphs over an extended range of voltages serves as a sensitive technique which reveals deviations of properties of the laser gas mixture over time. The same may be done with other input parameters than voltage which affect significant output parameters such as pulse energy, and with other output parameters which vary as the gas mixture deteriorates.

Moreover, comparison of a graph generated using data taken during a sub-routine some time after the most recent new fill and a master graph using data taken immediately after a new fill of a new laser with an optimal hardware and optical alignment configuration may or may not yield deviations. If no deviations are found, then the gas mixture and system hardware are determined to be satisfactory under the sub-routine of the present invention. Any deviations which are observed may have been observed in a previous comparison, such that conclusions can be drawn as to whether and what type of follow-up procedures should be performed and/or any follow-up procedures may then be performed either automatically or as initiated by a user, quickly and efficiently, and from experience. For example, a gas handling procedure can be performed to restore the gas mixture to its original starting condition either by replenishment, gas injections of one or more gases or replacement of gases or a new fill or otherwise by comparing the measured data sets and/or graphs generated from the data sets, observing any deviations and responding from experience and/or otherwise acquired knowledge of what the observed deviations are indicative of.

Preferably, output energy versus driving voltage curves are measured such as may be represented by a graph or table generated by the processor representing the current status of the gas mixture. Instead of a graph or table, another database configuration may be used. The processor then compares the current data set, graph or table to a stored data set, graph or table according to the flow chart shown in FIG. 4a, wherein a graph is used as an example. Generally, the processor analyzes any deviations between the current status and optimal or other known gas mixture statuses to determine what type of deviation is present and what follow-up procedure should then be performed, after comparing the current graph with the master graph and/or any of the processor's stored bank of graphs. A preferred procedure is more specifically set forth in the flow chart of FIG. 4a.

Figure 4A:
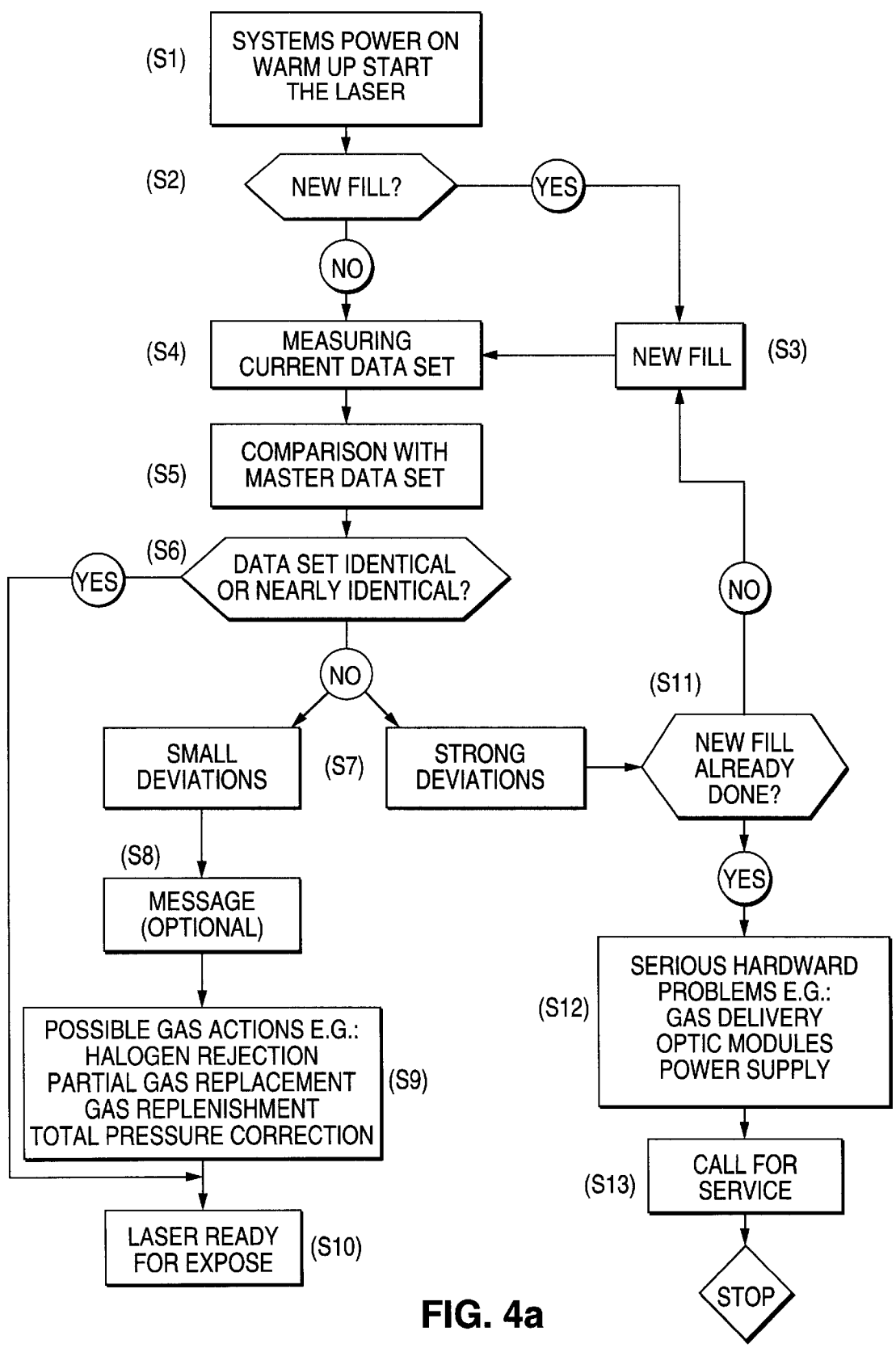
FIG. 4a is a flow chart showing a step-by-step procedure for monitoring the status of the laser gas mixture and other components of the laser system according to the present invention.

The exemplary procedure shown in FIG. 4a begins with a system power-on signal initiated by a user or otherwise begins a warm-up period which culminates in the emission of an output beam from the laser chamber and optical arrangement of the laser system (step S1). It is next determined whether a new fill is requested (step S2). If yes, then a new fill is performed (step S3). After the new fill is performed in step S3, or if no new fill is requested, then measurements are taken, after which a graph may be generated, and measurements are of preferably output beam energy versus driving voltage (step S4). Next, a comparison is made between the data measured in step S4, which may be in the form of a current graph generated in step S4, and one or more stored data sets, tables or graphs including at least the master data set, table or graph (step S5). In a preferred embodiment, the present age of the laser is first checked. Then the master data set, table or graph, of preferably a group of stored master data sets, tables or graphs, corresponding to the age range that includes the present age of the laser is selected to be used as the master data set, table or graph in step S5.

If the current data set, table or graph and the master data set, table or graph are determined to be identical, or nearly identical within specified tolerances (step S6), then the laser is ready to be used in industrial applications such as, e.g., photolithography (step S10), and steps S7–S9 and S11–S13 are not necessary. Thus, the procedure of the preferred embodiment of the present invention shown in FIG. 4a is finished for this run.

If the master and current data sets, tables or graphs are not identical, then it is determined whether large or small deviations exist (step S7). If a small deviation or deviations is/are observed, or deviations are observed which are outside of specified tolerances, then preferably a user is notified via a message (step S8), e.g., on a computer display, or an audio or visual alarm signal. A follow-up procedure may be performed either by user input, e.g., in response to receiving the message or signal, or automatically as initiated by the processor using a preprogrammed software routine (step S9). Such follow-up measures as halogen injection, partial gas replacement, gas replenishment and total pressure correction (e.g., by adjusting the gas temperature) may be performed. Consequent to the follow-up measures, the gas mixture is preferably returned to a state which deviates minimally from its original starting condition, such that substantially optimal laser system performance is again enabled, and industrial application of the laser system can go forward (step S10).

If a strong deviation or deviations are determined to be present, or deviations are observed which are far outside the specified tolerances described above and may be outside a second set of tolerances (step S7), then it is determined whether a new fill has just been performed or not (step S11). If a new fill has not just been performed, then a follow-up new fill is now performed (step S3).

After the follow-up new fill is performed, a data set is measured, and a graph or table may be generated, of preferably output energy versus driving voltage (step S4) and the procedure previously described is followed. If a new fill was just performed, and the current data set was measured immediately after the most recent new fill, then it is assumed that the gas mixture is optimal. In this case where the current data set was measured immediately after the most recent new fill, such that the gas mixture is assumed to be optimal, it is assumed that any deviation is not as a result of an aged gas mixture.

The fact that an electrical, mechanical or optical hardware problem exists somewhere in the system is thus suggested by the presence of a strong deviation (step S12). Some possible problems include trouble with the gas delivery system, optics modules of the system such as optical windows or line narrowing and/or tuning elements, the laser discharge chamber itself, electrical components such as the power supply and the beam path purging system. Some gas delivery problems include leakage, contamination of the gas cylinders, fluorine partial pressure changes from cylinder to cylinder, and contamination from the walls of nearly empty cylinders. A user is then preferably prompted to follow clear instructions to locate the problem and possibly call for service (step S13). These serious problems indicated by large deviations observed when comparing the current data set, table or graph with the master data set, table or graph are easily distinguished from gas aging because the large deviations of the current graph from the master graph are typically far stronger than those due to aging and are not eliminated by performing a new fill.

Figure 4B:
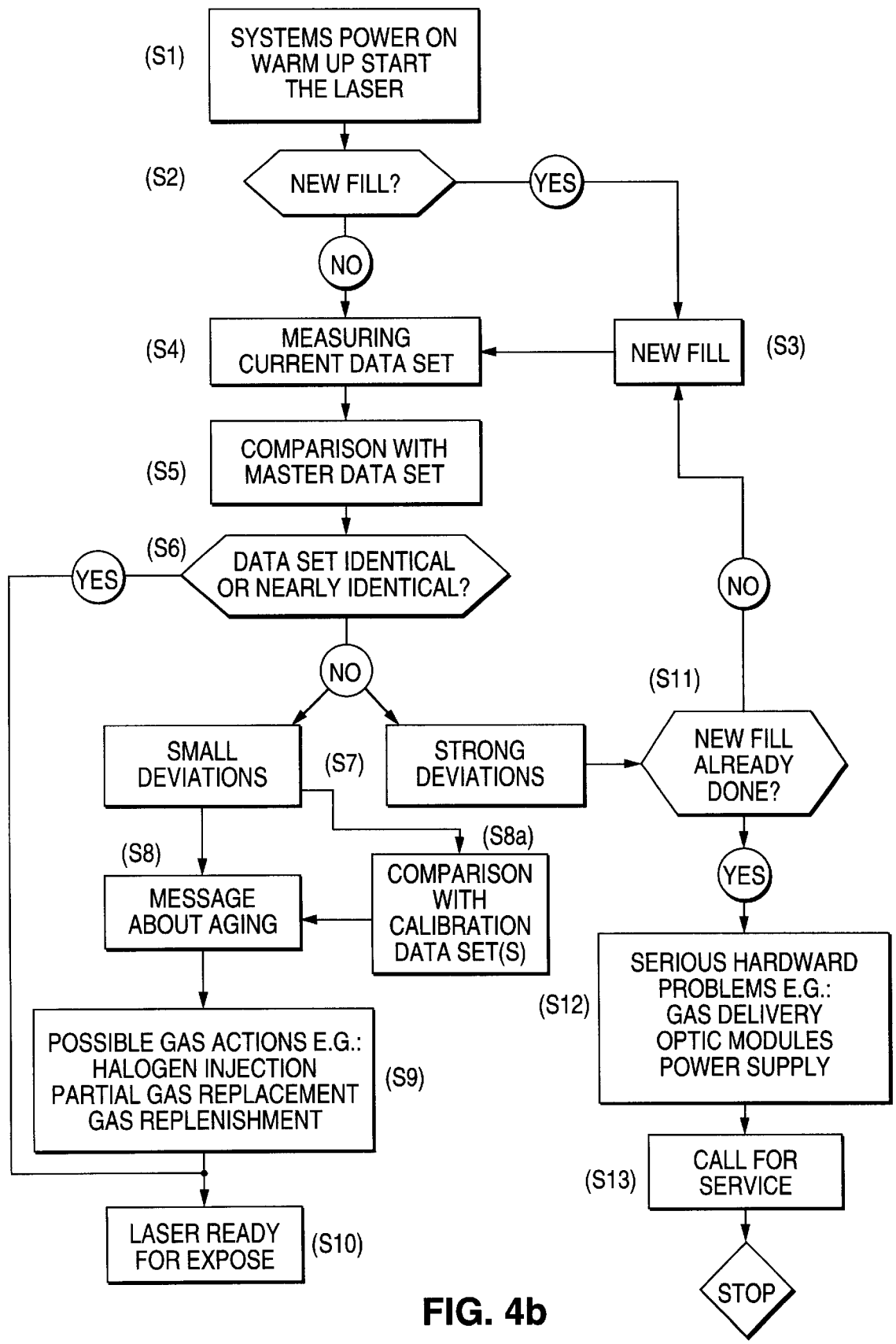
FIG. 4b is a flow chart showing a step-by-step procedure for monitoring the status of the laser gas mixture and other components of the laser system, including comparison of a current status data set with one or more calibration data sets, according to the present invention.

The method of FIG. 4b varies from that of FIG. 4a in that step 8 of FIG. 4a is replaced by steps 8a and 8b in FIG. 4b. In accord with the method of FIG. 4b, a bank of calibration data sets (not shown) is preferably stored in the memory of the processor sometime before the current status is measured. Typically, the calibration data sets are measured at the factory, defining a response of the laser system (or a like laser system) when operating with different gas mixtures of the types associated with common aging. Following step S7, after it has been determined that a small deviation or small deviations exist between the current status data set, table or graph and the master data set, table or graph, a comparison of the current status data set, table or graph with one or more or all of the calibration data sets, tables or graphs is performed (step S8A) to find one or more calibration data sets which are similarly deviated from the master data set. The processor then determines, from stored gas mixture data regarding the one or more similarly deviated calibration data sets, what type of follow-up procedure will be performed that will likely return the gas mixture to a more desirable status. For example, a follow-up procedure may include gas injection, partial replacement or other replenishment of a certain amount of $F_2$, HCl, an active rare gas or a combination thereof, or total pressure correction (e.g., by adjusting the gas temperature or total amount of gas in the discharge chamber). The processor may then initiate the follow-up procedure such that the follow-up procedure is automatically initiated and/or performed, with or without the assistance of a user.

Using the preferred method of the present invention, it is possible to determine the gas quality and partition composition. It is also easy to schedule times for new fills and gas replenishing follow-up procedures. Moreover, the method is very sensitive such that $F_2$ concentrations down to at least $3 \times 10^{-4}$ absolute are resolvable. That is, deviations of 0.3 percent or possibly less are detectable using the sensitive method of the present invention. The method is also efficiently performed by the processor using a special checking sub-routine not requiring additional hardware components to be added to an existing system, making implementation of the advantages of the present invention realizable at low cost. Further, the processor may operate the gas handling system in such a manner that the actual laser performance is automatically readjusted to the level of the master data set, thus principally enabling a system having a laser gas mixture with infinite lifetime.

Figure 5:
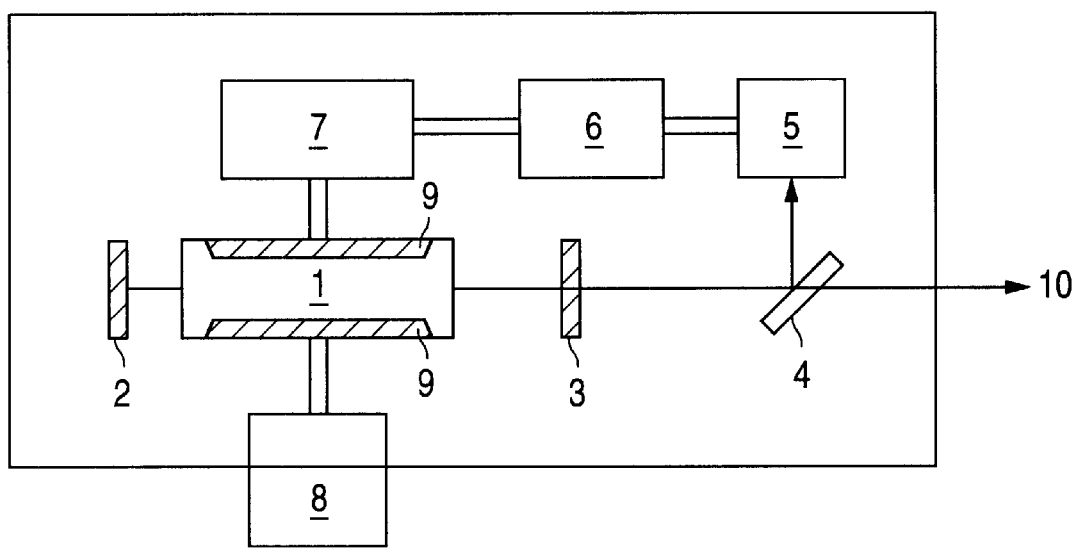
FIG. 5 shows a setup of a laser system arrangement according to the present invention.

A preferred arrangement of a gas discharge laser system having internal laser parameter control is shown in FIG. 5. The system includes a discharge chamber 1 containing the gas mixture and comprising a discharge circuit including electrodes 9 for driving a discharge through the gas mixture. A resonator defines an optical path through the laser tube 1 including, e.g., a high reflectivity reflection grating, highly reflecting back surface of a prism or a rear mirror 2, and an output coupling beam splitter or front mirror 3. The outcoupled portion of the beam impinges upon a beam splitter 4 such that a portion of the outcoupled beam is reflected to an internal energy monitor 5. An internal computer control system 6, or processor, receives data from the internal energy monitor 5.

The laser system further includes a power supply 7 for delivering energy to the gas mixture via applying a driving voltage to the electrodes 9 or discharge circuit of the discharge chamber 1. Values of the driving voltage are preferably received by the internal computer control system 6 corresponding preferably to detected values of output beam energy as measured by the internal energy monitor 5 and also received by the computer control system 6. The computer control system 6 preferably may store in a memory and retrieve from the memory the master and calibration data sets described above. The control system 6 may then generate a table or graph of any of the data sets or store the data sets in any form including a database format using at least a range or portion of the data sets. The control system 6 preferably performs many other functions as described above. A gas compartment 8 is connected with the discharge chamber 1 via gas lines and is flow controlled either by the internal computer control system 6 or manually. That portion of the outcoupled beam which is not reflected at the beam splitter 4 is the output beam 10 of the system.

The specific embodiments described in the specification, drawings, summary of the invention and abstract of the disclosure are not intended to limit the scope of any of the claims, but are only meant to provide illustrative examples of the invention to which the claims are drawn. The scope of the present invention is understood to be encompassed by the language of the claims, and structural and functional equivalents thereof.

What is claimed is:

1. A method for controlling a status of a laser gas mixture of an excimer or molecular fluorine gas discharge laser system which generates an output beam and includes a discharge chamber filled with the gas mixture within which energy is delivered by a power supply circuit to components of the gas mixture, comprising the steps of:
   operating the laser to generate the output beam;
   measuring a value of a first parameter of the laser system which varies substantially with a status of the gas mixture including a concentration of a halogen component thereof and which also tends to vary substantially with one or more other conditions of the laser system;
   determining a corresponding value of a second parameter of the laser system; and
   replenishing a halogen component of the gas mixture based on a known correspondence between
      (i) a relationship between the measured value of the first parameter and the determined corresponding value of the second laser system parameter, wherein the relationship varies substantially with the status of the gas mixture and does not tend to vary substantially with any of the one or more other conditions of the laser system which tend to vary the first parameter; and
      (ii) the status of the laser gas mixture.

2. The method of claim 1, wherein the first parameter corresponds to an energy of the output beam.

3. The method of claim 2, wherein the second laser system parameter corresponds to an energy delivered to the gas mixture by the power supply circuit.

4. The method of claim 1, wherein the relationship between the measured value of the first parameter and the determined value of the second parameter includes a slope of a plot of one of the values of the first and second parameters versus the other.

5. The method of claim 1, wherein the relationship between the measured first parameter and the second laser system parameter includes a ratio of a quantity relating to one of the values of the first and second parameters to a quantity relating to the other of the first and second parameters.

6. A method for controlling a status of a laser gas mixture of an excimer or molecular fluorine gas discharge laser system which generates an output beam and includes a discharge chamber filled with the gas mixture within which energy is delivered by a power supply circuit to components of the gas mixture, comprising the steps of:
   operating the laser to generate the output beam;
   taking at least a first measurement and a second measurement of a first parameter of the laser system to obtain a first measured value and a second measured value, respectively, wherein the first parameter varies substantially with a status of the gas mixture including a concentration of a halogen component thereof and tends to vary substantially with one or more other conditions of the laser system;
   determining at least a corresponding first and second values, respectively, of a second parameter of the laser system; and
   replenishing a halogen component of the gas mixture based on a known correspondence between
      (i) a relationship between
         (a) a relationship between the first measured value and the second measured value of the first parameter; and
         (b) a corresponding relationship between the first value and the second value of said second laser system parameter, wherein said relationship between (a) and (b) varies substantially with the status of the gas mixture and does not tend to vary substantially with any of the one or more other conditions of the laser system which tend to vary the first parameter; and
      (ii) the status of the laser gas mixture.

7. The method of claim 6, wherein the first value and the second value of the second laser system parameter correspond to values of the second laser system parameter when the measurements were taken of the first and second measured values of the first parameter.

8. The method of claim 6, wherein the relationship between the first measured value and the second measured value corresponds to a difference between the first measured value and the second measured value.

9. The method of claim 8, wherein the relationship between the first value and the second value of the second laser system parameter corresponds to a difference between the first value and the second value of the second laser system parameter.

10. The method of claim 6, wherein the relationship between the first value and the second value of the second laser system parameter corresponds to a difference between the first value and the second value of the second laser system parameter.

11. The method of claim 6, wherein the first parameter corresponds to an energy of the output beam.

12. The method of claim 11, wherein the second laser system parameter corresponds to an energy delivered to the gas mixture by the power supply circuit.

13. A method for controlling a status of a laser gas mixture of an excimer or molecular fluorine gas discharge laser system which generates an output beam and includes a discharge chamber filled with the gas mixture within which energy is delivered by a power supply circuit to components of the gas mixture, comprising the steps of:
   operating the laser system to generate the output beam;
   obtaining at least first and second different values of a first parameter of the laser system corresponding to first and second different values, respectively, of a second parameter of the laser system, wherein the first parameter varies substantially with a status of the gas mixture including a concentration of a halogen component thereof and tends to vary substantially with one or more other conditions of the laser system;
   replenishing a halogen component of the gas mixture based on a known correspondence between
      (i) a relationship between
         (a) a relationship between said first and second different values of said first laser system parameter; and
         (b) a corresponding relationship between said first and second different values of said second laser system parameter, wherein said relationship between (a) and (b) varies substantially with the status of the gas mixture and does not tend to vary substantially with any of the one or more other conditions of the laser system which tend to vary the first parameter; and
      (ii) the status of the laser gas mixture.

14. The method of claim 13, wherein the first value and the second value of the second laser system parameter correspond to values of the second laser system parameter when the first and second values of the first laser system parameter were obtained.

15. The method of claim 13, wherein the relationship between the first and second values of the first laser system parameter corresponds to a difference between the first and second values of the first laser system parameter.

16. The method of claim 15, wherein the relationship between the first value and the second value of the second laser system parameter corresponds to a difference between the first value and the second value of the second laser system parameter.

17. The method of claim 13, wherein the relationship between the first value and the second value of the second laser system parameter corresponds to a difference between the first value and the second value of the second laser system parameter.

18. The method of claim 13, wherein at least one of the first and second laser system parameters corresponds to an energy delivered to the gas mixture by the power supply circuit.

19. The method of claim 18, wherein the other of the first and second laser system parameters corresponds to a number of pulses of the output beam.

20. The method of claim 18, wherein the other of the first and second laser system parameters corresponds to a time of operation of the laser system.

21. The method of claim 18, wherein the other of the first and second laser system parameters corresponds to an energy of the output beam.

22. The method of claim 13, wherein at least one of the first and second parameters corresponds to a number of pulses of the output beam.

23. The method of claim 13, wherein at least one of the first and second laser system parameters corresponds to a time of operation of the laser system.

24. A method for controlling a status of a laser gas mixture of an excimer or molecular fluorine gas discharge laser system which generates an output beam and includes a discharge chamber filled with the gas mixture within which energy is delivered by a power supply circuit to components of the gas mixture, comprising the steps of:
   operating the laser system to generate the output beam;
   obtaining a first value of a first parameter of the laser system corresponding to a second value of a second parameter of the laser system, wherein the first parameter varies substantially with a status of the gas mixture including a concentration of a halogen component thereof and tends to vary substantially with one or more other conditions of the laser system;
   replenishing a halogen component of the gas mixture based on a comparison of:
      (a) a relationship between said first value of said first parameter of the laser system and said second value of said second parameter of the laser system, wherein said relationship between said first value of said first parameter and said second value of said second parameter varies substantially with the status of the gas mixture and does not tend to vary substantially with any of the one or more other conditions of the laser system which tend to vary the first parameter; and
      (b) a known correspondence between
         (i) said relationship between first value of said first parameter of the laser system and said second value of said second parameter of the laser system; and
         (ii) the status of the laser gas mixture.

25. A method for controlling a status of a laser gas mixture of an excimer or molecular fluorine gas discharge laser system which generates an output beam and includes a discharge chamber filled with the gas mixture within which energy is delivered by a power supply circuit to components of the gas mixture, comprising the steps of:
   operating the laser system to generate the output beam;
   obtaining a first value of a first parameter of the laser system corresponding to a second value of a second parameter of the laser system, wherein the first parameter varies substantially with a status of the gas mixture including a concentration of a halogen component thereof and tends to vary substantially with one or more other conditions of the laser system;
   replenishing a halogen component of the gas mixture based on a known correspondence between (i) a relationship between said first value of said first parameter of the laser system and said second value of said second parameter of the laser system, wherein said relationship between varies substantially with the status of the gas mixture and does not tend to vary substantially with any of the one or more other conditions of the laser system which tend to vary the first parameter; and (ii) the status of the laser gas mixture.

26. The method of claim 25, wherein at least one of the first and second laser system parameters corresponds to an energy delivered to the gas mixture by the power supply circuit.

27. The method of claim 26, wherein the other of the first and second laser system parameters corresponds to a number of pulses of the output beam.

28. The method of claim 26, wherein the other of the first and second laser system parameters corresponds to a time of operation of the laser system.

29. The method of claim 26, wherein the other of the first and second laser system parameter corresponds to an energy of the output beam.

30. The method of claim 25, wherein at least one of the first and second parameters corresponds to a number of pulses of the output beam.

31. The method of claim 25, wherein at least one of the first and second laser system parameters corresponds to a time of operation of the laser system.

32. The method of claim 25, wherein at least one of the first and second laser system parameters corresponds to an energy of the output beam.

* * * * *